United States Patent
Ohno et al.

(10) Patent No.: US 11,539,237 B2
(45) Date of Patent: Dec. 27, 2022

(54) UNINTERRUPTIBLE POWER SUPPLY SYSTEM AND UNINTERRUPTIBLE POWER SUPPLY

(71) Applicant: FUJI ELECTRIC CO., LTD., Kawasaki (JP)

(72) Inventors: Tatsuki Ohno, Kobe (JP); Kazuyoshi Umezawa, Kobe (JP); Masao Takeuchi, Kobe (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/340,630

(22) Filed: Jun. 7, 2021

(65) Prior Publication Data

US 2021/0391745 A1 Dec. 16, 2021

(30) Foreign Application Priority Data

Jun. 11, 2020 (JP) .............................. JP2020-101884

(51) Int. Cl.
*H02J 9/06* (2006.01)
*G01R 31/42* (2006.01)

(52) U.S. Cl.
CPC .............. *H02J 9/062* (2013.01); *G01R 31/42* (2013.01)

(58) Field of Classification Search
CPC .......... H02J 9/062; H02J 7/0047; H02J 9/068; G01R 31/42
See application file for complete search history.

(56) References Cited

U.S. PATENT DOCUMENTS

2020/0177021 A1* 6/2020 Abe ........................ H02J 9/062

FOREIGN PATENT DOCUMENTS

JP WO2018163397 * 9/2018
WO 2018/163397 A1 9/2018

* cited by examiner

*Primary Examiner* — Toan T Vu
(74) *Attorney, Agent, or Firm* — Manabu Kanesaka (57) ABSTRACT

An uninterruptible power supply system includes a plurality of uninterruptible power supplies, each of which includes a rectifier and an inverter and switches between a normal operation mode for normal operation and a load simulation mode for simulating a load.

9 Claims, 6 Drawing Sheets

UNINTERRUPTIBLE POWER SUPPLY SYSTEM AND UNINTERRUPTIBLE POWER SUPPLY

CROSS-REFERENCE TO RELATED APPLICATION

The present application claims priority of Japanese Patent Application No. 2020-101884 filed Jun. 11, 2020, the disclosure of which is hereby incorporated by reference.

BACKGROUND OF THE INVENTION

Field of the Invention

The present invention relates to an uninterruptible power supply system and an uninterruptible power supply.

Description of the Background Art

An uninterruptible power supply on which an electrical test is performed is known in general, as disclosed in International Publication No. WO2018/163397, for example.

International Publication No. WO2018/163397 discloses an uninterruptible power supply including a converter that converts AC power from an AC source into DC power, an inverter that converts the DC power converted by the converter into AC power, and a bypass circuit connected in parallel to the converter and the inverter. The bypass circuit supplies the AC power from the AC source to a load without causing the AC power to pass through the converter and the inverter.

In the uninterruptible power supply disclosed in International Publication No. WO2018/163397, at the time of the electrical test on the uninterruptible power supply, the AC power output from the inverter is regenerated on the AC source side (the upstream side of the converter) via the bypass circuit. Thus, a closed circuit is constructed via the converter, the inverter and the bypass circuit. Then, a current flows through the converter, the inverter, and the bypass circuit such that the electrical test on the uninterruptible power supply is performed. Furthermore, the electrical test is performed by the closed circuit via the converter, the inverter and the bypass circuit, and thus the electrical test on the uninterruptible power supply can be performed without separately connecting a device that simulates the load.

In the uninterruptible power supply disclosed in International Publication No. WO2018/163397, a current flows through the converter, the inverter, and the bypass circuit such that the electrical test on the uninterruptible power supply can be performed. However, a current flows through the converter, the inverter, and the bypass circuit in the uninterruptible power supply such that the electrical test is performed, and thus an electrical test including a power receiving board on the input side and a bus board on the output side of the uninterruptible power supply, both of which are provided outside the uninterruptible power supply, cannot be performed.

In general, an inverter of an uninterruptible power supply operates by voltage waveform control, and it is necessary to specify the distortion factor, voltage accuracy, response, etc. of an output voltage waveform. On the other hand, in International Publication No. WO2018/163397, it is conceivable that the inverter does not operate by voltage control that is original product operation. For example, in International Publication No. WO2018/163397, the frequency and voltage value of a load waveform at the time of the test are limited to values of an AC input (it is necessary to match an inverter output waveform with the AC input). That is, in International Publication No. WO2018/163397, an electrical test of whether or not it functions as an uninterruptible power supply is not performed, but the electrical test disclosed in International Publication No. WO2018/163397 is limited to a test in which only an electrical flow can be evaluated. That is, in International Publication No. WO2018/163397, the test cannot be performed with the uninterruptible power supply operating normally.

SUMMARY OF THE INVENTION

The present invention has been proposed in order to solve the aforementioned problems, and an object of the present invention is to provide an uninterruptible power supply system and an uninterruptible power supply on which a test including a power receiving board on the input side and a bus board on the output side of the uninterruptible power supply in addition to the uninterruptible power supply can be performed with the uninterruptible power supply operating normally without connecting a simulated load.

In order to attain the aforementioned object, an uninterruptible power supply system according to a first aspect of the present invention includes a plurality of uninterruptible power supplies connected in parallel to each other between a power receiving board to which AC power is supplied from an AC source and a bus board to which a load is connected. Each of the plurality of uninterruptible power supplies includes a rectifier to convert the AC power from the power receiving board into DC power, and an inverter to convert the DC power from the rectifier into AC power to supply the converted AC power to the bus board, and switches between a normal operation mode for normal operation and a load simulation mode for simulating the load.

In the uninterruptible power supply system according to the first aspect of the present invention, as described above, each of the plurality of uninterruptible power supplies switches between the normal operation mode for normal operation and the load simulation mode for simulating the load. Accordingly, some of the uninterruptible power supplies connected in parallel are set to the normal operation mode, and the other uninterruptible power supplies are set to the load simulation mode such that a closed circuit is formed by the uninterruptible power supplies in the normal operation mode, the bus board, the uninterruptible power supplies in the load simulation mode, and the power receiving board. Then, a current is output from the uninterruptible power supplies in the normal operation mode, and regenerative operation is performed by the uninterruptible power supplies in the load simulation mode such that the current flows through this closed circuit. The uninterruptible power supply to be tested is in the normal operation mode. Thus, the test including the power receiving board on the input sides and the bus board on the output sides of the uninterruptible power supplies in addition to the uninterruptible power supplies can be performed with the uninterruptible power supply operating normally without connecting a simulated load.

In the aforementioned uninterruptible power supply system according to the first aspect, each of the plurality of uninterruptible power supplies preferably further includes a controller, the controller is preferably configured to perform a control to switch between the normal operation mode and the load simulation mode, and a test is preferably performed by a current flowing through an uninterruptible power supply switched to the normal operation mode by the controller, the bus board, an uninterruptible power supply switched to the load simulation mode by the controller, and the power receiving board. Accordingly, the controller can easily switch between the normal operation mode and the load simulation mode, and thus the test in which a current flows through the uninterruptible power supply in the normal operation mode, the bus board, the uninterruptible power supply in the load simulation mode, and the power receiving board can be easily performed. Furthermore, the uninterruptible power supply in the normal operation mode and the uninterruptible power supply in the load simulation mode are switched around by the controller such that the test can be performed on any of the plurality of uninterruptible power supplies.

In this case, the controller provided in each of the plurality of uninterruptible power supplies is preferably configured to transmit and receive a parallel interlocking signal to perform parallel interlocking operation between its own uninterruptible power supply and another uninterruptible power supply, and is preferably configured to cut off transmission and reception of the parallel interlocking signal, and transmission and reception of the parallel interlocking signal to and from the uninterruptible power supply switched to the load simulation mode among the plurality of uninterruptible power supplies is preferably cut off. Accordingly, the uninterruptible power supply in the load simulation mode is independent of the uninterruptible power supply that performs the parallel interlocking operation, and thus the test of the parallel interlocking operation of the uninterruptible power supply in the normal operation mode can be performed regardless of the load operation of the uninterruptible power supply in the load simulation mode.

In the aforementioned uninterruptible power supply system on which the test is performed by the current flowing through the uninterruptible power supplies, the bus board, and the power receiving board, the test of the plurality of uninterruptible power supplies preferably includes at least one of a load fluctuation test or an AC source power failure test, each of which is performed by a current flowing through the uninterruptible power supply switched to the normal operation mode, the bus board, the uninterruptible power supply switched to the load simulation mode, and the power receiving board. Accordingly, at least one of the load fluctuation test or the AC source power failure test, which includes the power receiving board and the bus board, can be performed.

In the aforementioned uninterruptible power supply system on which the test is performed by the current flowing through the uninterruptible power supplies, the bus board, and the power receiving board, each of the plurality of uninterruptible power supplies preferably includes a bypass circuit connected in parallel to the rectifier and the inverter to supply the AC power from the power receiving board to the bus board, and the test of the plurality of uninterruptible power supplies preferably includes a switching test between a current path via the bypass circuit and a current path via the rectifier and the inverter performed by a current flowing through the uninterruptible power supply switched to the normal operation mode, the bus board, the uninterruptible power supply switched to the load simulation mode, and the power receiving board. When a closed circuit is formed by the rectifier, the inverter, and the bypass circuit, and the test is performed by the current flowing through the closed circuit, it is necessary to maintain the closed circuit state during the test, and thus the switching test between the current path via the bypass circuit and the current path via the rectifier and the inverter cannot be performed. Therefore, with the above configuration, the switching test between the current path via the bypass circuit and the current path via the rectifier and the inverter can be easily performed.

In the aforementioned uninterruptible power supply system on which the test is performed by the current flowing through the uninterruptible power supplies, the bus board, and the power receiving board, the plurality of uninterruptible power supplies preferably includes the uninterruptible power supply in the normal operation mode, the uninterruptible power supply in the load simulation mode, and an uninterruptible power supply in a stopped state, the controller of the uninterruptible power supply in the stopped state is preferably configured to transmit a current command to the controller of the uninterruptible power supply in the load simulation mode, and is preferably configured to detect a voltage of an output bus that connects the plurality of uninterruptible power supplies to each other to transmit the voltage to the controller of the uninterruptible power supply in the normal operation mode and the controller of the uninterruptible power supply in the load simulation mode, and each of the controller of the uninterruptible power supply in the normal operation mode and the controller of the uninterruptible power supply in the load simulation mode is preferably configured to calculate a wiring impedance up to the bus board based on the transmitted voltage of the output bus. Accordingly, each of the plurality of uninterruptible power supplies is controlled based on the calculated wiring impedance such that the characteristics of the uninterruptible power supply system can be improved (the output current balance of the plurality of uninterruptible power supplies, for example, can be adjusted).

In this case, the controller of the uninterruptible power supply in the normal operation mode is preferably configured to control the inverter of its own uninterruptible power supply so as to compensate for a voltage drop due to the wiring impedance based on the calculated wiring impedance. Accordingly, a decrease in the output voltage of the bus board due to the wiring impedance can be suppressed. That is, the output voltage of the bus board can be controlled to a rated voltage.

In the aforementioned uninterruptible power supply system in which the wiring impedance is calculated, the controller of each of the plurality of uninterruptible power supplies that operates in parallel to each other is preferably configured to adjust a parameter for suppressing a cross flow that flows between the plurality of uninterruptible power supplies that operates in parallel to each other based on the calculated wiring impedance. Accordingly, the cross flow caused by the imbalance of the wiring impedances of the wiring on the output sides of the plurality of uninterruptible power supplies can be easily suppressed based on the calculated wiring impedances.

In the aforementioned uninterruptible power supply system according to the first aspect, the uninterruptible power supply system preferably operates in parallel to another uninterruptible power supply system, and a test is preferably performed by a current flowing through its own uninterruptible power supply system switched to one of the normal operation mode and the load simulation mode, and the another uninterruptible power supply system switched to the other of the normal operation mode and the load simulation mode. Accordingly, in the uninterruptible power supply systems connected in parallel to each other, the test including the power receiving boards on the input sides and the bus boards on the output sides of the uninterruptible power supplies in addition to the uninterruptible power supplies can be performed without connecting a simulated load.

An uninterruptible power supply connected in parallel between a power receiving board to which AC power is supplied from an AC source and a bus board to which a load is connected according to a second aspect of the present invention includes a rectifier to convert the AC power from the power receiving board into DC power, an inverter to convert the DC power from the rectifier into AC power to supply the converted AC power to the bus board, and a power storage connected to a DC intermediate portion between the rectifier and the inverter. The uninterruptible power supply switches between a normal operation mode for normal operation and a load simulation mode for simulating the load.

As described above, the uninterruptible power supply according to the second aspect of the present invention switches between the normal operation mode for normal operation and the load simulation mode for simulating the load. Accordingly, some of the uninterruptible power supplies connected in parallel are set to the normal operation mode, and the other uninterruptible power supplies are set to the load simulation mode such that a closed circuit is formed by the uninterruptible power supplies in the normal operation mode, the bus board, the uninterruptible power supplies in the load simulation mode, and the power receiving board. Then, a current is output from the uninterruptible power supplies in the normal operation mode, and regenerative operation is performed by the uninterruptible power supplies in the load simulation mode such that the current flows through this closed circuit. Thus, it is possible to provide the uninterruptible power supply on which a test including the power receiving board on the input sides and the bus board on the output sides of the uninterruptible power supplies in addition to the uninterruptible power supplies can be performed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention is hereinafter described with reference to the drawings.

The configuration of an uninterruptible power supply system 600 according to the embodiment is now described with reference to FIGS. 1 to 5.

Configuration of Uninterruptible Power Supply System

Figure 1:
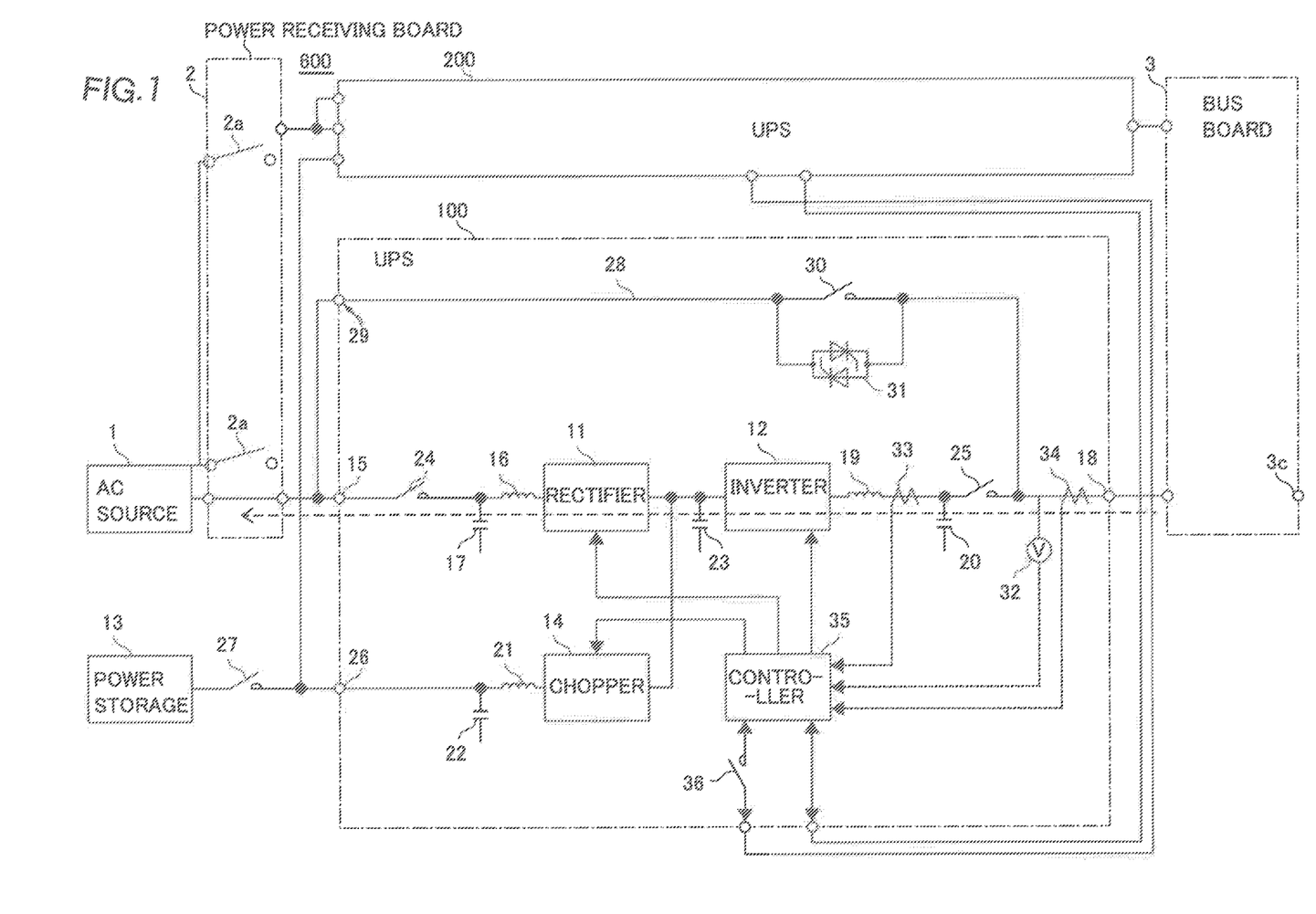
FIG. 1 is a block diagram showing the configuration of uninterruptible power supplies of an uninterruptible power supply system according to an embodiment.
Figure 3:
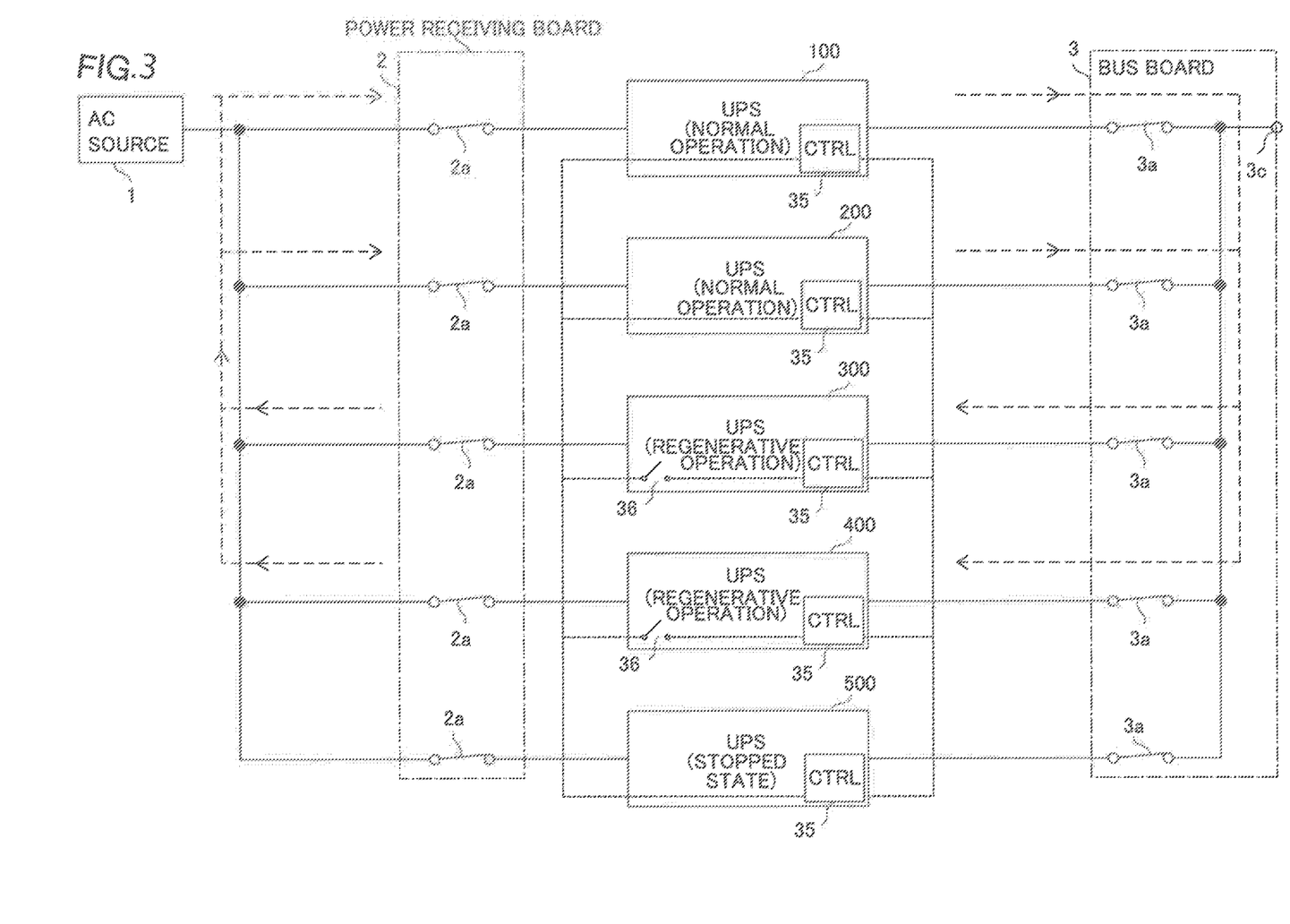
FIG. 3 is a block diagram showing the overall configuration of the uninterruptible power supply system according to the embodiment.

As shown in FIG. 1, the uninterruptible power supply system 600 includes a plurality of uninterruptible power supplies (UPS: uninterruptible power supplies 100 to 500) connected in parallel to each other between a power receiving board 2 to which AC power is supplied from an AC source 1 and a bus board 3 to which a load is connected. Although two uninterruptible power supplies 100 and 200 are shown in FIG. 1, the uninterruptible power supply system 600 includes five uninterruptible power supplies 100 to 500, as shown in FIG. 3, for example. The number of uninterruptible power supplies is not limited to five.

AC power is input from the AC source 1 to the power receiving board 2. The power receiving board 2 includes switches 2a (see FIG. 3) according to the number of the plurality of uninterruptible power supplies 100 to 500. Each of the switches 2a switches between an electrically connected state and a disconnected state between the AC source 1 and each of the uninterruptible power supplies 100 to 500.

AC power is input from the plurality of uninterruptible power supplies 100 to 500 to the bus board 3. The bus board 3 includes switches 3a (see FIG. 3) according to the number of the plurality of uninterruptible power supplies 100 to 500. Furthermore, the bus board 3 includes a bus board connecting point 3b (see FIG. 4) that connects the output sides of the plurality of uninterruptible power supplies 100 to 500. Each of the switches 3a switches between an electrically connected state and a disconnected state for each of the plurality of uninterruptible power supplies 100 to 500 to the bus board connecting point 3b.

Configuration of Uninterruptible Power Supply

The configuration of the uninterruptible power supplies 100 to 500 is now described. The plurality of uninterruptible power supplies 100 to 500 has the same configuration, and thus the configuration of the uninterruptible power supply 100 is described.

The uninterruptible power supply 100 includes a rectifier 11 that can convert AC power from the power receiving panel 2 into DC power. Furthermore, the uninterruptible power supply 100 includes an inverter 12 that can convert DC power from the rectifier 11 into AC power and supply the converted AC power to the bus board 3.

The uninterruptible power supply 100 includes a power storage 13 connected to a DC intermediate portion between the rectifier 11 and the inverter 12. The power storage 13 may be provided in common to the plurality of uninterruptible power supplies 100 to 500, or may be individually provided for each of the plurality of uninterruptible power supplies 100 to 500.

A chopper 14 is provided between the power storage 13 and the DC intermediate portion. The chopper 14 controls charging and discharging of DC power stored in the power storage 13. The uninterruptible power supply in a load simulation mode described below may or may not be provided with the power storage 13.

A filter reactor 16 is connected in series to the AC input terminal 15 side of the rectifier 11, and a filter capacitor 17 is connected in parallel to the AC input terminal 15 side of the rectifier 11. A filter reactor 19 is connected in series to the AC output terminal 18 side of the inverter 12, and a filter capacitor 20 is connected in parallel to the AC output terminal 18 side of the inverter 12. A filter reactor 21 is connected in series to the power storage 13 side of the chopper 14, and a filter capacitor 22 is connected in parallel to the power storage 13 side of the chopper 14. A DC intermediate capacitor 23 is connected to the DC intermediate portion between the rectifier 11 and the inverter 12.

An electromagnetic contactor 24 is provided between an AC input terminal 15 and the filter reactor 16. An electromagnetic contactor 25 is provided between an AC output terminal 18 and the filter reactor 19. An electromagnetic contactor 27 is provided between the power storage 13 and a storage battery connection terminal 26.

The uninterruptible power supply 100 includes a bypass circuit 28 that is connected in parallel to the rectifier 11 and the inverter 12 and supplies AC power from the power receiving board 2 to the bus board 3. An electromagnetic contactor 30 and a thyristor switch 31 are provided between a bypass input terminal 29 of the bypass circuit 28 and the AC output terminal 18.

The uninterruptible power supply 100 includes a bus voltage detector 32. The bus voltage detector 32 detects the voltage of the AC output terminal 18 and transmits the detected voltage to a controller (CTRL) 35. Furthermore, the uninterruptible power supply 100 includes an inverter current detector 33. The inverter current detector 33 detects a current output from the inverter 12 and transmits the detected current to the controller 35. Moreover, the uninterruptible power supply 100 includes a bus current detector 34. The bus current detector 34 detects a current output from the AC output terminal 18 to the outside of the uninterruptible power supply 100 and transmits the detected current to the controller 35.

The uninterruptible power supply 100 includes the controller 35. The controller 35 transmits a control signal to the rectifier 11, the inverter 12, and the chopper 14. In this embodiment, the controller 35 provided in each of the plurality of uninterruptible power supplies 100 to 500 can transmit and receive a parallel interlocking signal to perform parallel interlocking operation between its own uninterruptible power supply (the uninterruptible power supply 100, for example) and another uninterruptible power supply (the uninterruptible power supply 200, for example), and can cut off transmission and reception of the parallel interlocking signal. Specifically, a switch 36 is provided in the wiring that connects the controller 35 to the controller 35 of another uninterruptible power supply 200. The controller 35 may perform control calculation so as to cut off transmission and reception of the parallel interlocking signal without providing the switch 36.

In this embodiment, each of the plurality of uninterruptible power supplies 100 to 500 can switch between a normal operation mode for normal operation and a load simulation mode for simulating a load. Specifically, the controller 35 performs a control to switch between the normal operation mode and the load simulation mode. In FIG. 1, the uninterruptible power supply 200 is in the normal operation mode, and the uninterruptible power supply 100 is in the load simulation mode. The uninterruptible power supply 100 in the load simulation mode performs regenerative operation. That is, in the uninterruptible power supply 100 in the load simulation mode, the inverter 12 causes power to flow into the DC intermediate portion. The rectifier 11 outputs (regenerates) power input from the DC intermediate portion to the AC input terminal 15. That is, the flow of power is in a direction of the dashed arrow. The rectifier 11 and the chopper 14 of each of the uninterruptible power supply 200 in the normal operation mode and the uninterruptible power supply 100 in the load simulation mode are controlled by the conventional method. The uninterruptible power supply 100 in the load simulation mode operates as a passive load or an active load.

Figure 2:
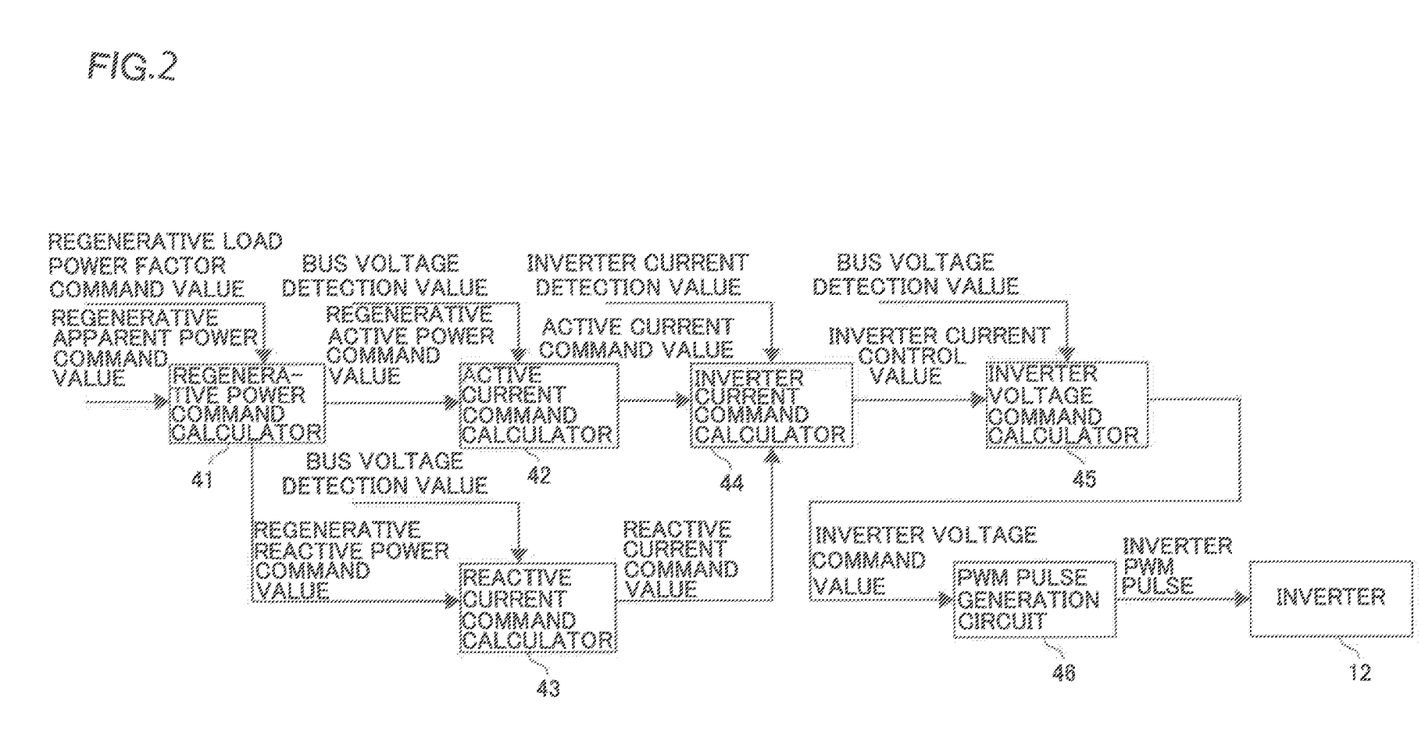
FIG. 2 is a control block diagram of a controller of the uninterruptible power supply system according to the embodiment.

Control (control blocks) of the controller 35 of the uninterruptible power supply 100 in the load simulation mode (regenerative operation) is now described with reference to FIG. 2.

The controller 35 includes a regenerative power command calculator 41. The regenerative power command calculator 41 generates a regenerative active power command value and a regenerative reactive power command value by performing the following calculation using an input regenerative load power factor command value and an input regenerative apparent power command value. The regenerative load power factor command value and the regenerative apparent power command value are collectively referred to as a load power command value below.

$$\text{(regenerative active power command value)} = \text{(regenerative apparent power command value)} \times \text{(regenerative load power factor command value)}$$

$$\text{(regenerative reactive power command value)} = \text{(regenerative apparent power command value)} \times \sqrt{\{1 - \text{(regenerative load power factor command value)}^2\}}$$

The load power command value may be input from a command value table generated in advance based on the characteristics of the simulated load, or may be directly input by an examiner via a display of the uninterruptible power supply 100, for example. Furthermore, the regenerative active power command value and the regenerative reactive power command value may be directly input by the examiner via the display of the uninterruptible power supply 100, for example.

The controller 35 includes an active current command calculator 42. The active current command calculator 42 generates an active current command value based on the regenerative active power command value input from the regenerative power command calculator 41 and a detection value (voltage) detected by the bus voltage detector 32.

The controller 35 includes a reactive current command calculator 43. The reactive current command calculator 43 generates a reactive current command value based on the regenerative reactive power command value input from the regenerative power command calculator 41 and the detection value (voltage) detected by the bus voltage detector 32.

The controller 35 includes an inverter current command calculator 44. The inverter current command calculator 44 generates a current command value based on the active current command value input from the active current command calculator 42 and the reactive current command value input from the reactive current command calculator 43. Then, the inverter current command calculator 44 generates an inverter current control value by multiplying a deviation between the generated current command value and a detection value detected by the inverter current detector 33 by a proportional gain. In this embodiment, the controller 35 uses proportional control, but a general control method other than proportional control such as proportional integral control can also be used.

The controller 35 includes an inverter voltage command calculator 45. The inverter voltage command calculator 45 generates an inverter voltage command value based on the inverter current control value generated by the inverter current command calculator 44 and the detection value detected by the bus voltage detector 32.

The controller 35 includes a PWM pulse generation circuit 46. The PWM pulse generation circuit 46 generates an inverter PWM pulse by performing pulse width modulation based on the inverter voltage command value generated by the inverter voltage command calculator 45. Then, the controller 35 transmits the generated inverter PWM pulse to the inverter 12. The inverter 12 operates based on the inverter PWM pulse transmitted from the PWM pulse generation circuit 46. That is, the inverter 12 performs a current control so as to conform to the given apparent power command value and load power factor command value.

A parallel system for testing the uninterruptible power supplies 100 to 500 is now described with reference to FIG. 3. In FIG. 3, the five uninterruptible power supplies 100 to 500 are connected in parallel to each other. The uninterruptible power supplies 100 and 200 are tested. The uninterruptible power supplies 100 and 200 to be tested are in the normal operation mode. The uninterruptible power supplies 300 and 400 are in the load simulation mode and perform the regenerative operation. The test is performed in a state in which the load is not connected to a load connection terminal 3c of the bus board 3. The uninterruptible power supply 500 is not involved in the test and is either stopped or cut off from the power receiving board 2 and the bus board 3.

In this embodiment, transmission and reception of the parallel interlocking signal to and from the uninterruptible power supplies 300 and 400 switched to the load simulation mode among the plurality of uninterruptible power supplies 100 to 500 is cut off. That is, before the start of the test, the switches 36, which cut off transmission and reception of the parallel interlocking signal, provided in the uninterruptible power supplies 300 and 400 that perform the regenerative operation are turned off to prevent cooperation (interlocking) between the uninterruptible power supplies 100 and 200 that perform the normal operation and the uninterruptible power supplies 300 and 400 that perform the regenerative operation. The controller 35 of each of the uninterruptible power supplies 300 and 400 may perform control calculation so as to cut off transmission and reception of the parallel interlocking signal.

At the start of the test, first, the uninterruptible power supplies 100 and 200 that perform the normal operate are started. At this time, the uninterruptible power supplies 100 and 200 are in a state of operating in parallel with no load. Then, the uninterruptible power supplies 300 and 400 are started so as to synchronize with voltages output by the uninterruptible power supplies 100 and 200. Then, a regenerative load power command for the inverter 12 of each of the uninterruptible power supplies 300 and 400 is activated. Thus, power output from the uninterruptible power supplies 100 and 200 flows into the AC output terminals 18 of the uninterruptible power supplies 300 and 400. Furthermore, the uninterruptible power supplies 100 and 200 interlocked in parallel supply power to a bus in order to compensate for fluctuations in the voltage of the bus.

The rectifiers 11 of the uninterruptible power supplies 100 to 400 try to match the voltage of the DC intermediate portion with an internal command value (a command value from its own controller 35). Therefore, the rectifiers 11 of the uninterruptible power supplies 100 and 200 that perform the normal operation convert power from AC power into DC power. The rectifiers 11 of the uninterruptible power supplies 300 and 400 that perform the regenerative operation convert power from DC power into AC power. Thus, the power flows in a direction of the dashed arrow in FIG. 3.

That is, in this embodiment, a current flows through the uninterruptible power supplies 100 and 200 switched to the normal operation mode by the controller 35, the bus board 3, the uninterruptible power supplies 300 and 400 switched to the load simulation mode, and the power receiving board 2 such that the test is performed. Thus, the uninterruptible power supplies 300 and 400 that perform the regenerative operation are controlled as loads on the uninterruptible power supplies 100 and 200 to be tested, and the test including the power receiving board 2 and the bus board 3 in addition to the uninterruptible power supplies 100 and 200 can be performed.

In this embodiment, the test of the uninterruptible power supplies 100 and 200 includes at least one (both in this embodiment) of a load fluctuation test or an AC source 1 power failure test, each of which is performed by a current flowing through the uninterruptible power supplies 100 and 200 switched to the normal operation mode, the bus board 3, the uninterruptible power supplies 300 and 400 switched to the load simulation mode, and the power receiving board 2.

In the load fluctuation test, the load change speeds of the uninterruptible power supplies 300 and 400 can switch between "sudden change" and "slow change", and the load fluctuation test can be performed regardless of whether the load change speed is "sudden change" or "slow change". Furthermore, in the load fluctuation test, a load change test in a load increasing direction and a load change test in a load decreasing direction can be performed. For example, the change value of load power is set to increase from XkW to YkW (X and Y are arbitrary values, and X<Y). Thus, a current flows while the loads of the uninterruptible power supplies 300 and 400 increase (suddenly or slowly change) from XkW to YkW. Furthermore, the change value of the load power is set to decrease from YkW to XkW. Thus, a current flows while the loads of the uninterruptible power supplies 300 and 400 decrease (suddenly or slowly change) from YkW to XkW. In this manner, the load fluctuation test on the uninterruptible power supplies 100 and 200 is performed. After the load fluctuation test is completed, the load change speed may be set to "sudden change" or "slow change".

In the AC source 1 power failure test, first, the switches 2a corresponding to the uninterruptible power supplies 100 and 200 in the power receiving board 2 are turned off to simulate the input power failures of the uninterruptible power supplies 100 and 200. The uninterruptible power supplies 100 and 200 detect the input power failures and switch to battery operation (operation to supply power from the power storage 13). Then, the switches 2a corresponding to the uninterruptible power supplies 100 and 200 in the power receiving board 2 are turned on to simulate the input power return of the uninterruptible power supplies 100 and 200. The uninterruptible power supplies 100 and 200 detect the input power return and gradually switch to AC operation (operation to supply AC power via the rectifier 11 and the inverter 12). In this manner, the AC source 1 power failure test on the uninterruptible power supplies 100 and 200 is performed.

In this embodiment, the test of the uninterruptible power supplies 100 and 200 includes a switching test between a current path via the bypass circuit 28 (hereinafter referred to as bypass power supply) and a current path via the rectifier 11 and the inverter 12 (hereinafter referred to as inverter power supply) performed by the current flowing through the uninterruptible power supplies 100 and 200 switched to the normal operation mode, the bus board 3, the uninterruptible power supplies 300 and 400 switched to the load simulation mode, and the power receiving board 2. In this test, first, commands are issued through operation boards (not shown) of the uninterruptible power supplies 100 and 200 to switch to bypass power supply. Thus, the uninterruptible power supplies 100 and 200 switch from inverter power supply to bypass power supply. Furthermore, commands are issued through the operation boards (not shown) of the uninterruptible power supplies 100 and 200 to switch to inverter power supply. Thus, the uninterruptible power supplies 100 and 200 switch from bypass power supply to inverter power supply. In this manner, the switching test between inverter power supply and bypass power supply on the uninterruptible power supplies 100 and 200 is performed.

The test of the uninterruptible power supplies includes an overload test. In the overload test, the number of uninterruptible power supplies in the overload (normal operation mode) and the number of uninterruptible power supplies in the load simulation mode are set so as to satisfy the relationship (total load amount of uninterruptible power supplies in normal mode to be tested)<(total rated capacity of uninterruptible power supplies in load simulation mode). For example, the uninterruptible power supplies 100 and 200 are started in the normal operation mode as overload test targets. In the uninterruptible power supplies 100 and 200, inverter power supply is performed. Then, the uninterruptible power supplies 300 to 500 are started in the load simulation mode. Then, the loads of the uninterruptible power supplies 300 to 500 are increased. Thus, the uninterruptible power supplies 100 and 200 are in an overloaded state, and after a certain period of time, the power supply is switched to bypass power supply. Then, the loads of the uninterruptible power supplies 300 to 500 are decreased. Thus, the overloaded states of the uninterruptible power supplies 100 and 200 are eliminated, and the power supply is switched to inverter power supply. In this manner, the overload test on the uninterruptible power supplies 100 and 200 is performed. The number of uninterruptible power supplies in the normal operation mode may be one, and the number of uninterruptible power supplies in the load simulation mode may be plural.

In FIG. 3, the uninterruptible power supplies 100 and 200 are tested, but the combination of the uninterruptible power supply(ies) in the normal operation mode, the uninterruptible power supply(ies) in the load simulation mode, and the uninterruptible power supply(ies) in the stopped state is switched such that the test on any of the uninterruptible power supplies 100 to 500 can be performed. In FIG. 3, the uninterruptible power supply that is not involved in the test (flow test), such as the uninterruptible power supply 500 in the stopped state, can be separated from the power receiving board 2 and the bus board 3.

Thus, the test of the uninterruptible power supplies 100 and 200 of the uninterruptible power supply system 600 can be performed without connecting a simulated load device to the load connection terminal 3c. Furthermore, a loss generated during the test is only a loss generated in a path through which a current flows via the uninterruptible power supplies 100 and 200, the bus board 3, the uninterruptible power supplies 300 and 400, and the power receiving board 2, and thus the loss can be relatively reduced. Therefore, energy saving can be achieved in the test of the configuration in which the uninterruptible power supplies 100 and 200 are provided in parallel.

In the above operation description, the operating characteristics of the uninterruptible power supplies and an embodiment of the electrical test such as the overload test are shown, but in the following, an embodiment of characteristics improvement regarding power supply characteristics of the plurality of uninterruptible power supplies 100 to 500 connected in parallel up to the bus board 3 is shown.

Figure 4:
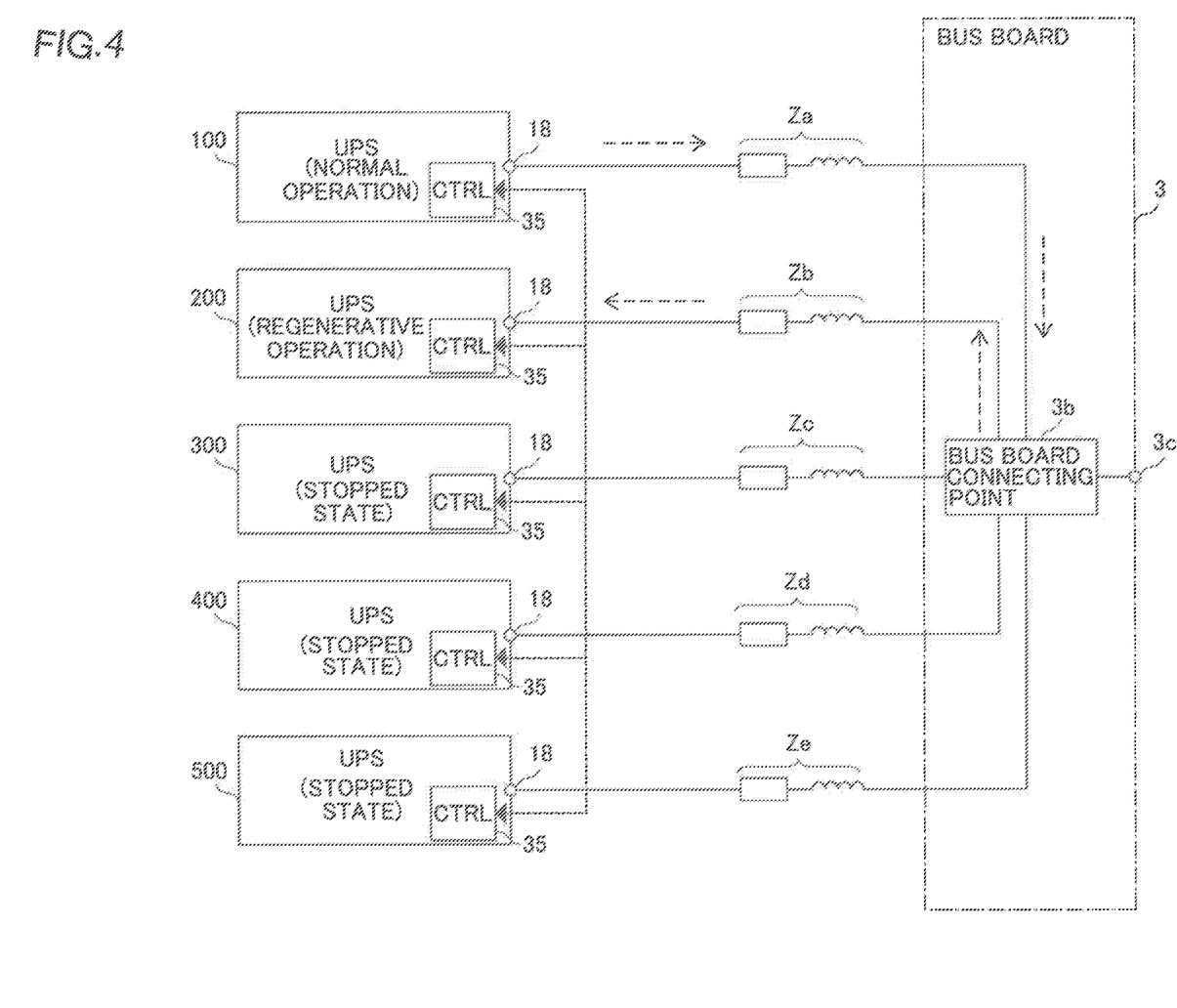
FIG. 4 is a diagram for illustrating wiring impedances between the uninterruptible power supplies and a bus board.

Calculation of a wiring impedance between the AC output terminal 18 of each of the plurality of uninterruptible power supplies 100 to 500 and the bus board connecting point 3b in the bus board 3 is now described with reference to FIG. 4. In FIG. 4, illustration of the configuration on the power receiving board 2 side is omitted. Furthermore, in FIG. 4, the wiring impedances between the uninterruptible power supplies 100 to 500 and the bus board connecting point 3b are represented as Za to Ze, respectively. In FIG. 4, each of the wiring impedances Za to Ze is represented by a resistance element and an inductor element. In the above description of FIG. 3, the uninterruptible power supply in the stopped state is not involved in the test (flow test), and thus it is described that the uninterruptible power supply in the stopped state can be separated from the power receiving board 2 and the bus board 3. However, the uninterruptible power supply in the stopped state is also used to calculate the wiring impedance, and thus it is necessary to connect at least one uninterruptible power supply in the stopped state to the power receiving board 2 and the bus board 3.

As shown in FIG. 4, in this embodiment, the plurality of uninterruptible power supplies 100 to 500 is the uninterruptible power supply 100 in the normal operation mode, the uninterruptible power supply 200 in the load simulation mode, and the uninterruptible power supplies 300, 400, and 500 in the stopped state. The controller 35 of the uninterruptible power supply in the stopped state (the uninterruptible power supply 300, for example) transmits a current command (a regenerative load power factor command value for flowing a current with a power factor of 1.0) to the controller 35 of the uninterruptible power supply 200 in the load simulation mode. Furthermore, the controller 35 of the uninterruptible power supply 300 detects the voltage of the output bus (a voltage at the bus board connecting point 3b) that connects the plurality of uninterruptible power supplies 100 to 500 to each other to transmit the same to the controller 35 of the uninterruptible power supply 100 in the normal operation mode. No current flows through the uninterruptible power supplies 300 to 500 that are stopped. Therefore, a voltage drop due to the wiring impedances between the uninterruptible power supplies 300 to 500 and the bus board connecting point 3b does not occur. Thus, the voltage of the bus voltage detector 32 of the uninterruptible power supply 300 and the voltage at the bus board connecting point 3b become equal to each other, and thus the bus voltage detector 32 of the uninterruptible power supply 300 can detect the voltage at the bus board connecting point 3b.

Thus, a current having a power factor of 1.0 flows between the uninterruptible power supply 100 in the normal operation mode and the uninterruptible power supply 200 in the load simulation mode, and thus the detection value of the bus voltage detector 32 of the uninterruptible power supply 100 is compared with the voltage value of the bus board connecting point 3b such that a voltage drop generated by the resistance component of the wiring impedance Za can be detected. Furthermore, the resistance component of the wiring impedance Za can be calculated based on the detection value of the bus current detector 34 of the uninterruptible power supply 100 and the detected voltage drop.

The detection value of the bus current detector 34 of the uninterruptible power supply 200 in the load simulation mode is compared with the voltage value of the bus board connecting point 3b such that a voltage drop generated by the resistance component of the wiring impedance Zb can be detected. Furthermore, the resistance component of the wiring impedance Zb can be calculated based on the detection value of the bus current detector 34 of the uninterruptible power supply 200 and the detected voltage drop.

The controller 35 of the uninterruptible power supply in the stopped state (the uninterruptible power supply 300, for example) transmits, to the controller 35 of the uninterruptible power supply 200 in the load simulation mode, a regenerative load power factor command value for flowing a current with a power factor lagging behind and being lower than 1.0 (a lagging power factor of 0.8, for example). Thus, the voltage drop generated by the resistance component and the inductance component of the wiring impedance Za and the voltage drop generated by the resistance component and the inductance component of the wiring impedance Zb can be detected. Then, based on the resistance components of the wiring impedances Za and Zb calculated as described above and the detection value of the bus current detector 34 of each of the uninterruptible power supply 100 and the uninterruptible power supply 200, the inductance components of the wiring impedances Za and Zb can be calculated.

Thus, in this embodiment, the controller 35 of the uninterruptible power supply 100 in the normal operation mode and the controller 35 of the uninterruptible power supply 200 in the load simulation mode calculate the wiring impedances Za and Zb up to the bus board 3 (bus board connecting point 3*b*) based on the transmitted voltage of the output bus, respectively. Furthermore, the combination of the uninterruptible power supply(ies) in the normal operation mode, the uninterruptible power supply(ies) in the load simulation mode, and the uninterruptible power supply(ies) in the stopped state is changed such that the wiring impedances Zc to Ze of the uninterruptible power supplies 300 to 500 can be calculated.

A parallel balance control in the uninterruptible power supply system 600 is now described with reference to FIG. 5 using the wiring impedance calculated as described above.

Figure 5:
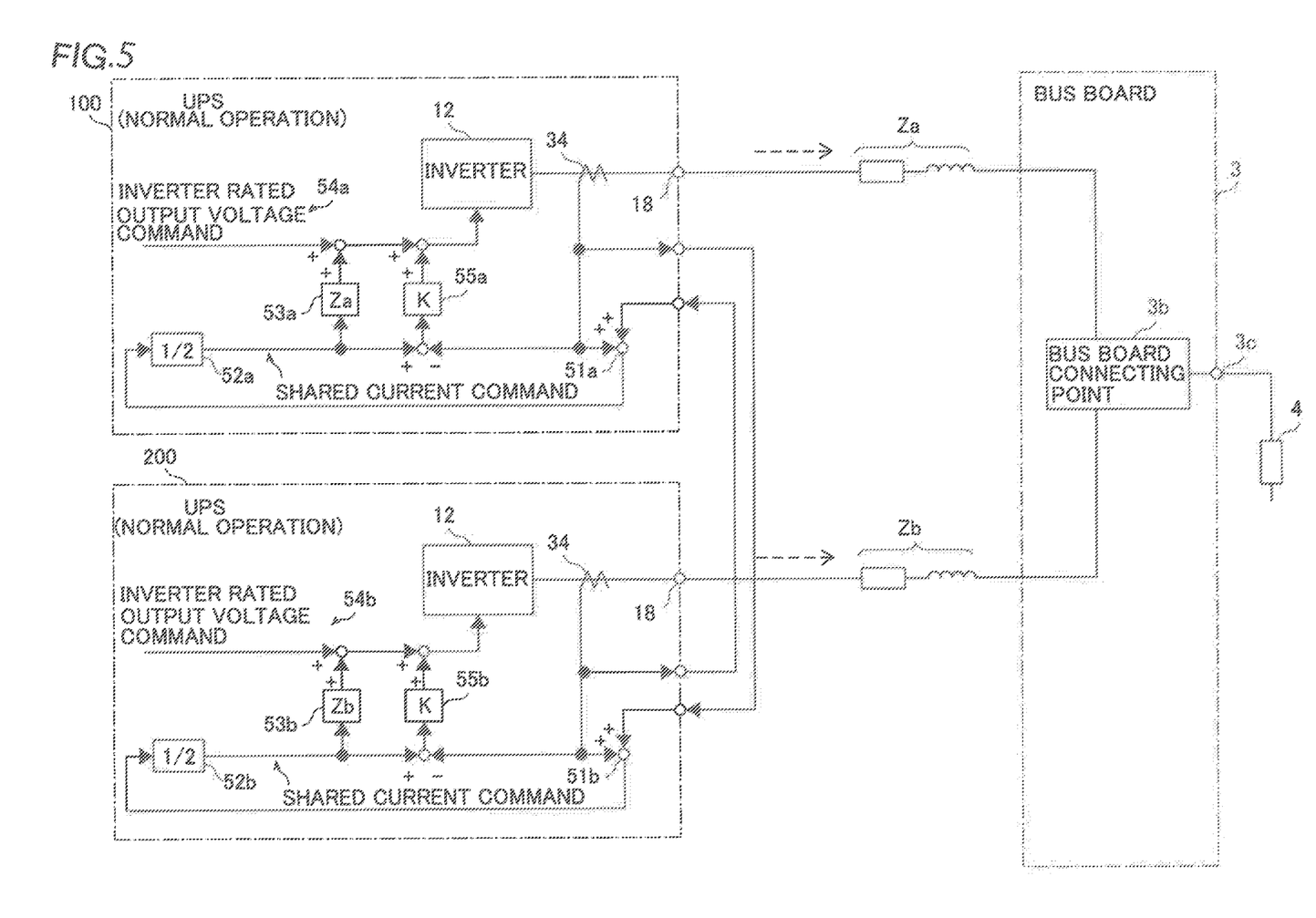
FIG. 5 is a diagram for illustrating parallel balance control based on the wiring impedances between the uninterruptible power supplies and the bus board.

In FIG. 5, a parallel balance control in a state in which the uninterruptible power supply 100 and the uninterruptible power supply 200 are connected in parallel to each other is described. The uninterruptible power supply 100 and the uninterruptible power supply 200 are in the normal operation mode. A load 4 is connected to the load connection terminal 3*c* of the bus board 3, and power is supplied to the load 4 from the uninterruptible power supply 100 and the uninterruptible power supply 200.

First, the uninterruptible power supply 100 detects a bus current by the bus current detector 34. Then, the detected detection value is added by a bus current adder 51*a* and a bus current adder 51*b* of the uninterruptible power supply 200. Similarly, the uninterruptible power supply 200 detects a bus current by the bus current detector 34. Then, the detected detection value is added by the bus current adder 51*b* and the bus current adder 51*a* of the uninterruptible power supply 100. Thus, the sum of currents output by the uninterruptible power supply 100 and the uninterruptible power supply 200 is acquired in each of the bus current adder 51*a* and the bus current adder 51*b*. The bus current adder 51*a* and the bus current adder 51*b* may perform addition on the software of the controller 35 or by hardware such as an operational amplifier as long as the same can add current information (detection value).

The acquired sum of the currents output by the uninterruptible power supply 100 and the uninterruptible power supply 200 is multiplied by a shared current calculation gain 52*a* in the uninterruptible power supply 100 and by a shared current calculation gain 52*b* in the uninterruptible power supply 200. Thus, a shared current (shared current command) to be output by each of the uninterruptible power supply 100 and the uninterruptible power supply 200 is calculated. In FIG. 5, the number of uninterruptible power supplies 100 and 200 connected in parallel is two, and thus the gain is 1/2. In this embodiment, when the number of uninterruptible power supplies connected in parallel is n (natural number), the gain is 1/n. On the other hand, a gain distribution for calculating a shared current in each of the uninterruptible power supplies can be freely set such that the total becomes 100%. For example, when the rated capacities of the uninterruptible power supplies are different, the gain distribution may be set based on a ratio of the rated capacities.

In this embodiment, the controllers 35 of the uninterruptible power supplies 100 and 200 in the normal operation mode control the inverters 12 of their own uninterruptible power supplies 100 and 200 so as to compensate for the voltage drops due to the wiring impedances Za and Zb based on the calculated wiring impedances Za and Zb. Specifically, in the uninterruptible power supply 100, the calculated shared current command is multiplied by a voltage drop compensation gain 53*a* that reflects the wiring impedance Za acquired as described above such that a voltage drop that occurs when a shared current flows can be estimated (calculated). This voltage drop is added as a compensation value to an inverter rated output voltage command 54*a* calculated by control of the conventional uninterruptible power supply 100.

Similarly, in the uninterruptible power supply 200, the calculated shared current command is multiplied by a voltage drop compensation gain 53*b* that reflects the wiring impedance Zb acquired as described above such that a voltage drop that occurs when a shared current flows can be estimated (calculated). This voltage drop is added as a compensation value to an inverter rated output voltage command 54*b* calculated by control of the conventional uninterruptible power supply 200. Thus, the output voltage of the bus board 3 is controlled to the rated voltage.

In this embodiment, the controllers 35 of the plurality of uninterruptible power supplies 100 and 200 that operate in parallel to each other adjust cross flow control gains 55*a* and 55*b* for suppressing a cross flow between the plurality of uninterruptible power supplies 100 and 200 that operates in parallel to each other based on the calculated wiring impedances Za and Zb, respectively. Specifically, in the uninterruptible power supply 100, a deviation between the shared current command value and the detection value of the bus current detector 34 of the uninterruptible power supply 100 is multiplied by the cross flow control gain 55*a* such that a correction is made to suppress a cross flow. Similarly, in the uninterruptible power supply 200, a deviation between the shared current command value and the detection value of the bus current detector 34 of the uninterruptible power supply 200 is multiplied by the cross flow control gain 55*b* such that a correction is made to suppress a cross flow. The cross flow control gains 55*a* and 55*b* are examples of a "parameter for suppressing a cross flow" in the claims.

Conventionally, the wiring impedances Za and Zb between the uninterruptible power supplies 100 and 200 and the bus board 3 are unknown, and thus the cross flow control gains 55*a* and 55*b* are generally set to the same value in the uninterruptible power supplies 100 and 200. In this case, when the wiring impedances Za and Zb between the uninterruptible power supplies 100 and 200 and the bus board 3 are varied, the influence of a cross flow suppression control on output currents changes depending on the magnitudes of the wiring impedances Za and Zb, and thus output currents from the uninterruptible power supplies 100 and 200 do not completely match, and a cross flow cannot be suppressed.

On the other hand, in this embodiment, a ratio of the cross flow control gains 55a and 55b is set to a ratio of the calculated wiring impedances Za and Zb such that the influence of the cross flow suppression control on the output currents becomes equal in the uninterruptible power supplies 100 and 200, and thus the accuracy of the cross flow suppression control can be improved.

Advantageous Effects of This Embodiment

According to this embodiment, the following advantageous effects are achieved.

According to this embodiment, as described above, each of the plurality of uninterruptible power supplies 100 to 500 switches between the normal operation mode for normal operation and the load simulation mode for simulating the load. Accordingly, some of the uninterruptible power supplies 100 to 500 connected in parallel are set to the normal operation mode, and the other uninterruptible power supplies are set to the load simulation mode such that a closed circuit is formed by the uninterruptible power supplies in the normal operation mode, the bus board 3, the uninterruptible power supplies in the load simulation mode, and the power receiving board 2. A current is output from the uninterruptible power supplies in the normal operation mode, and the regenerative operation is performed by the uninterruptible power supplies in the load simulation mode such that the current flows through this closed circuit. Thus, the test including the power receiving board 2 on the input sides and the bus board 3 on the output sides of the uninterruptible power supplies in addition to the uninterruptible power supplies can be performed without connecting a simulated load.

According to this embodiment, the controllers 35 perform a control to switch between the normal operation mode and the load simulation mode, and the test is performed by the current flowing through the uninterruptible power supplies switched to the normal operation mode by the controllers 35, the bus board 3, the uninterruptible power supplies switched to the load simulation mode by the controllers 35, and the power receiving board 2. Accordingly, the controllers 35 can easily switch between the normal operation mode and the load simulation mode, and thus the test in which a current flows through the uninterruptible power supplies in the normal operation mode, the bus board 3, the uninterruptible power supplies in the load simulation mode, and the power receiving board 2 can be easily performed. Furthermore, the uninterruptible power supplies in the normal operation mode and the uninterruptible power supplies in the load simulation mode are switched around by the controllers 35 such that the test can be performed on any of the plurality of uninterruptible power supplies 100 to 500.

According to this embodiment, as described above, the controller 35 provided in each of the plurality of uninterruptible power supplies 100 to 500 transmits and receives the parallel interlocking signal to perform the parallel interlocking operation between its own uninterruptible power supply and another uninterruptible power supply, and transmission and reception of the parallel interlocking signal to and from the uninterruptible power supply switched to the load simulation mode among the plurality of uninterruptible power supplies 100 to 500 is cut off. Accordingly, the uninterruptible power supply in the load simulation mode is independent of the uninterruptible power supply that performs the parallel interlocking operation, and thus the test of the parallel interlocking operation of the uninterruptible power supply in the normal operation mode can be performed regardless of the load operation of the uninterruptible power supply in the load simulation mode.

According to this embodiment, as described above, the test of the uninterruptible power supplies 100 to 500 includes at least one of the load fluctuation test or the AC source 1 power failure test, each of which is performed by the current flowing through the uninterruptible power supplies switched to the normal operation mode, the bus board 3, the uninterruptible power supplies switched to the load simulation mode, and the power receiving board 2. Accordingly, at least one of the load fluctuation test or the AC source 1 power failure test, which includes the power receiving board 2 and the bus board 3, can be performed.

According to this embodiment, as described above, the test of the uninterruptible power supplies 100 to 500 includes the switching test between the current path via the bypass circuit 28 and the current path via the rectifier 11 and the inverter 12 performed by the current flowing through the uninterruptible power supplies switched to the normal operation mode, the bus board 3, the uninterruptible power supplies switched to the load simulation mode, and the power receiving board 2. When a closed circuit is formed by the rectifier 11, the inverter 12, and the bypass circuit 28, and the test is performed by the current flowing through the closed circuit, it is necessary to maintain the closed circuit state during the test, and thus the switching test between the current path via the bypass circuit 28 and the current path via the rectifier 11 and the inverter 12 cannot be performed. Therefore, with the above configuration, the switching test between the current path via the bypass circuit 28 and the current path via the rectifier 11 and the inverter 12 can be easily performed.

According to this embodiment, as described above, the plurality of uninterruptible power supplies 100 to 500 includes the uninterruptible power supply in the normal operation mode, the uninterruptible power supply in the load simulation mode, and the uninterruptible power supplies in the stopped state, the controller 35 of the uninterruptible power supply in the stopped state transmits the current command to the controller 35 of the uninterruptible power supply in the load simulation mode and detects the voltage of the output bus that connects the plurality of uninterruptible power supplies 100 to 500 to each other to transmit the same to the controller 35 of the uninterruptible power supply in the normal operation mode and the controller 35 of the uninterruptible power supply in the load simulation mode, and the controller 35 of the uninterruptible power supply in the normal operation mode and the controller 35 of the uninterruptible power supply in the load simulation mode calculate the wiring impedances up to the bus board 3 based on the transmitted voltage of the output bus, respectively. Accordingly, each of the plurality of uninterruptible power supplies 100 to 500 is controlled based on the calculated wiring impedance such that the characteristics of the uninterruptible power supply system 600 can be improved (the output current balance of the plurality of uninterruptible power supplies 100 to 500, for example, can be adjusted).

According to this embodiment, as described above, the controllers 35 of the uninterruptible power supplies in the normal operation mode control the inverters 12 of their own uninterruptible power supplies so as to compensate for the voltage drops due to the wiring impedances based on the calculated wiring impedances. Accordingly, a decrease in the output voltage of the bus board 3 due to the wiring impedance can be suppressed. That is, the output voltage of the bus board 3 can be controlled to the rated voltage.

According to this embodiment, as described above, the controllers 35 of the plurality of uninterruptible power supplies 100 to 200 that operates in parallel to each other adjust the cross flow control gains 55a and 55b for suppressing the cross flow that flows between the plurality of uninterruptible power supplies 100 to 200 that operates in parallel to each other based on the calculated wiring impedances, respectively. Accordingly, the cross flow caused by the imbalance of the wiring impedances of the wiring on the output sides of the plurality of uninterruptible power supplies 100 and 200 can be easily suppressed based on the calculated wiring impedances. When the uninterruptible power supplies 100 to 500 operate in parallel to each other, it is necessary to adjust the cross flow control gains of the uninterruptible power supplies 100 to 500 in order to suppress the cross flow that flows between the uninterruptible power supplies 100 to 500.

Modified Examples

The embodiment disclosed this time must be considered as illustrative in all points and not restrictive. The scope of the present invention is not shown by the above description of the embodiment but by the scope of claims for patent, and all modifications (modified examples) within the meaning and scope equivalent to the scope of claims for patent are further included.

For example, while the uninterruptible power supply system 600 includes the five uninterruptible power supplies 100 to 500 in the aforementioned embodiment, the present invention is not restricted to this. In the present invention, the uninterruptible power supply system 600 is only required to include two or more uninterruptible power supplies.

The uninterruptible power supplies according to this embodiment are connected to a single uninterruptible power supply of another system or an uninterruptible power supply parallel system of another system using a load branch board or the like such that the same or similar test can be performed.

While the test of the uninterruptible power supplies 100 to 500 includes the load fluctuation test, the AC source 1 power failure test, and the switching test between inverter power supply and bypass power supply in the aforementioned embodiment, the present invention is not restricted to this. In the present invention, a test other than these tests may alternatively be performed.

While each of the uninterruptible power supplies 100 to 500 includes the bypass circuit 28 in the aforementioned embodiment, the present invention is not restricted to this. The present invention can also be applied to an uninterruptible power supply that does not include the bypass circuit 28.

While the chopper 14 is provided between the DC intermediate portion and the power storage 13 in the aforementioned embodiment, the present invention is not restricted to this. The present invention can also be applied to an uninterruptible power supply that does not include the chopper 14.

Figure 6:
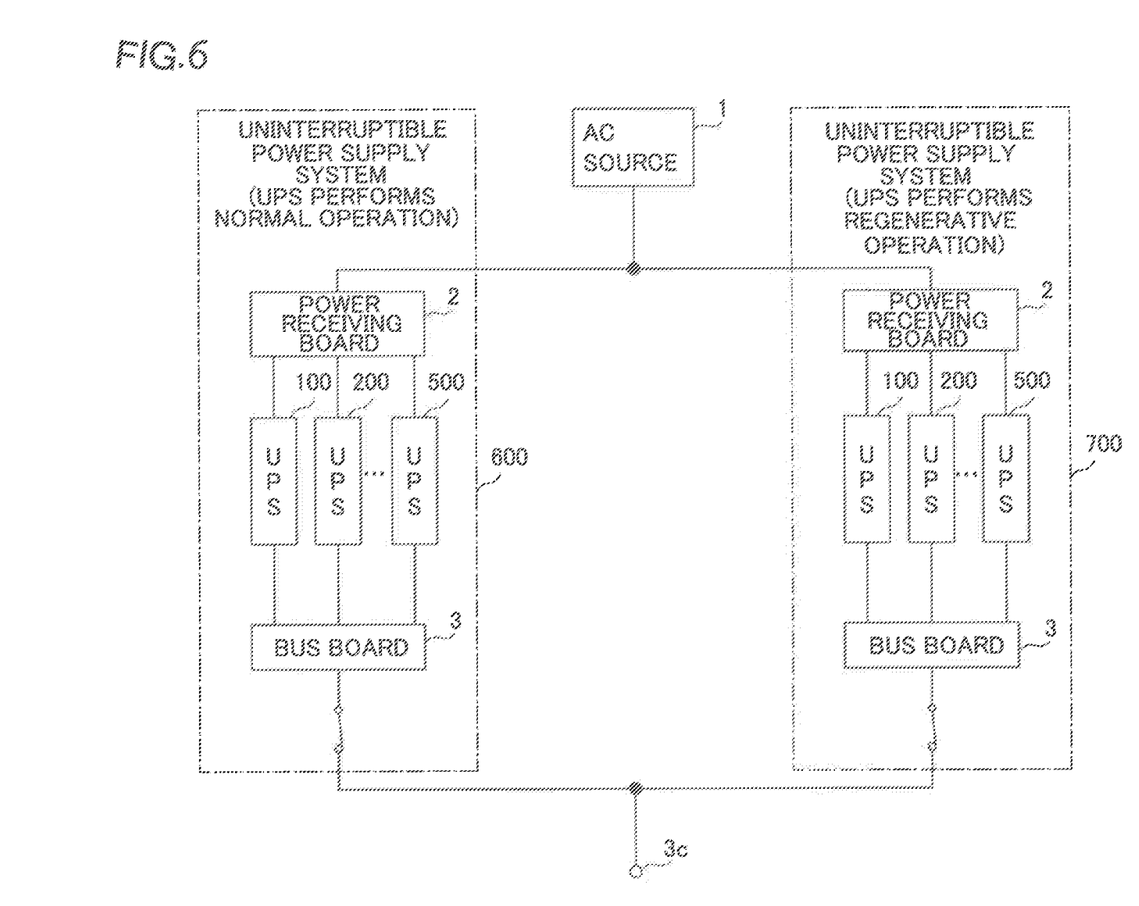
FIG. 6 is a diagram for illustrating a test of uninterruptible power supplies in a plurality of uninterruptible power supply systems that operates in parallel according to a modified example.

While inside one uninterruptible power supply system 600, the plurality of uninterruptible power supplies 100 to 500 is switched to the normal operation mode, the load simulation mode, or the stopped state for testing in the aforementioned embodiment, the present invention is not restricted to this. For example, as shown in FIG. 6, the uninterruptible power supply system 600 is configured to operate in parallel to another uninterruptible power supply system 700. Then, a test may be performed by a current flowing through its own uninterruptible power supply system 600 switched to one of a normal operation mode and a load simulation mode, and another uninterruptible power supply system 700 switched to the other of the normal operation mode and the load simulation mode.

For example, all uninterruptible power supplies 100 to 500 in the uninterruptible power supply system 600 operate in the normal operation mode, and all uninterruptible power supplies 100 to 500 in the uninterruptible power supply system 700 operate in the load simulation mode (perform regenerative operation). The test procedure is the same as in the above embodiment, and with the uninterruptible power supplies 100 to 500 of the uninterruptible power supply system 600 operating in the normal operation mode, a load power command is activated in the uninterruptible power supplies 100 to 500 of the uninterruptible power supply system 700. Thus, a current flows through the uninterruptible power supply system 600, bus boards 3, the uninterruptible power supply system 700, and power receiving boards 2. Consequently, the test of the uninterruptible power supplies 100 to 500 of the uninterruptible power supply system 600 can be performed without connecting a simulated load device to a load connection terminal 3c. Furthermore, a loss generated during the test is only a loss generated in a path through which a current flows via the uninterruptible power supply system 600, the bus boards 3, the uninterruptible power supply system 700, and the power receiving boards 2, and thus the loss can be relatively reduced. Therefore, energy saving can be achieved even in the test of the configuration in which the uninterruptible power supply systems 600 and 700 having a large rated capacity are provided in parallel.

Thus, in the uninterruptible power supply systems 600 and 700 connected in parallel to each other, the test including the power receiving boards 2 on the input sides and the bus boards 3 on the output sides of the uninterruptible power supplies 100 to 500 in addition to the uninterruptible power supplies 100 to 500 can be performed without connecting a simulated load.

What is claimed is:

1. An uninterruptible power supply system comprising:
a plurality of uninterruptible power supplies connected in parallel to each other between a power receiving board to which AC power is supplied from an AC source and a bus board to which a load is connected; wherein
each of the plurality of uninterruptible power supplies:
includes a rectifier to convert the AC power from the power receiving board into DC power, a first switch provided between the power receiving board and the rectifier, an inverter to convert the DC power from the rectifier into AC power to supply the converted AC power to the bus board, a second switch provided between the inverter and the bus board, and a controller; and
switches between a normal operation mode for normal operation and a load simulation mode for simulating the load,
wherein the controller is configured to perform a control to switch between the normal operation mode and the load simulation mode; and
a test is performed by a current flowing through an uninterruptible power supply switched to the normal operation mode by the controller, the bus board, an uninterruptible power supply switched to the load simulation mode by the controller, and the power receiving board.

2. The uninterruptible power supply system according to claim 1, wherein
the controller provided in each of the plurality of uninterruptible power supplies is configured to transmit and receive a parallel interlocking signal to perform parallel interlocking operation between its own uninterruptible power supply and another uninterruptible power supply, and is configured to cut off transmission and reception of the parallel interlocking signal; and
transmission and reception of the parallel interlocking signal to and from the uninterruptible power supply switched to the load simulation mode among the plurality of uninterruptible power supplies is cut off.

3. The uninterruptible power supply system according to claim 1, wherein the test of the plurality of uninterruptible power supplies includes at least one of a load fluctuation test or an AC source power failure test, each of which is performed by a current flowing through the uninterruptible power supply switched to the normal operation mode, the bus board, the uninterruptible power supply switched to the load simulation mode, and the power receiving board.

4. The uninterruptible power supply system according to claim 1, wherein
each of the plurality of uninterruptible power supplies includes a bypass circuit connected in parallel to the rectifier and the inverter to supply the AC power from the power receiving board to the bus board; and
the test of the plurality of uninterruptible power supplies includes a switching test between a current path via the bypass circuit and a current path via the rectifier and the inverter performed by a current flowing through the uninterruptible power supply switched to the normal operation mode, the bus board, the uninterruptible power supply switched to the load simulation mode, and the power receiving board.

5. The uninterruptible power supply system according to claim 1, wherein
the plurality of uninterruptible power supplies includes the uninterruptible power supply in the normal operation mode, the uninterruptible power supply in the load simulation mode, and an uninterruptible power supply in a stopped state;
the controller of the uninterruptible power supply in the stopped state is configured to transmit a current command to the controller of the uninterruptible power supply in the load simulation mode, and is configured to detect a voltage of an output bus that connects the plurality of uninterruptible power supplies to each other to transmit the voltage to the controller of the uninterruptible power supply in the normal operation mode and the controller of the uninterruptible power supply in the load simulation mode; and
each of the controller of the uninterruptible power supply in the normal operation mode and the controller of the uninterruptible power supply in the load simulation mode is configured to calculate a wiring impedance up to the bus board based on the transmitted voltage of the output bus.

6. The uninterruptible power supply system according to claim 5, wherein the controller of the uninterruptible power supply in the normal operation mode is configured to control the inverter of its own uninterruptible power supply so as to compensate for a voltage drop due to the wiring impedance based on the calculated wiring impedance.

7. The uninterruptible power supply system according to claim 5, wherein the controller of each of the plurality of uninterruptible power supplies that operates in parallel to each other is configured to adjust a parameter for suppressing a cross flow that flows between the plurality of uninterruptible power supplies that operates in parallel to each other based on the calculated wiring impedance.

8. The uninterruptible power supply system according to claim 1, wherein
the uninterruptible power supply system operates in parallel to another uninterruptible power supply system; and
the test is performed by a current flowing through its own uninterruptible power supply system switched to one of the normal operation mode and the load simulation mode, and the another uninterruptible power supply system switched to another of the normal operation mode and the load simulation mode.

9. An uninterruptible power supply in a plurality of uninterruptible power supplies connected in parallel between a power receiving board to which AC power is supplied from an AC source and a bus board to which a load is connected, the uninterruptible power supply comprising:
a rectifier to convert the AC power from the power receiving board into DC power;
a first switch provided between the power receiving board and the rectifier;
an inverter to convert the DC power from the rectifier into AC power to supply the converted AC power to the bus board;
a second switch provided between the inverter and the bus board;
a power storage connected to a DC intermediate portion between the rectifier and the inverter; and
a controller,
wherein the controller switches between a normal operation mode for normal operation and a load simulation mode for simulating the load, and
a test is performed by a current flowing through an uninterruptible power supply switched to the normal operation mode by the controller, the bus board, an uninterruptible power supply switched to the load simulation mode by the controller, and the power receiving board.

* * * * *